United States Patent
Li et al.

(10) Patent No.: US 10,332,944 B2
(45) Date of Patent: Jun. 25, 2019

(54) OLED PIXEL UNIT WITH PHOTONIC CRYSTAL ARRAY AND METHOD OF PRODUCING THE SAME

(71) Applicant: BOE TECHNOLOGY GROUP CO., LTD., Beijing (CN)

(72) Inventors: Yanzhao Li, Beijing (CN); Li Sun, Beijing (CN); Ze Liu, Beijing (CN); Huai-Ting Shih, Beijing (CN); Qijun Zha, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 14/771,455

(22) PCT Filed: Oct. 29, 2014

(86) PCT No.: PCT/CN2014/089797
§ 371 (c)(1),
(2) Date: Aug. 28, 2015

(87) PCT Pub. No.: WO2016/026212
PCT Pub. Date: Feb. 25, 2016

(65) Prior Publication Data
US 2016/0365392 A1 Dec. 15, 2016

(30) Foreign Application Priority Data
Aug. 22, 2014 (CN) .......................... 2014 1 0418900

(51) Int. Cl.
*H01L 29/08* (2006.01)
*H01L 27/32* (2006.01)
(Continued)

(52) U.S. Cl.
CPC ........ *H01L 27/3232* (2013.01); *H01L 27/322* (2013.01); *H01L 27/3258* (2013.01);
(Continued)

(58) Field of Classification Search
CPC combination set(s) only.
See application file for complete search history.

(56) References Cited

U.S. PATENT DOCUMENTS 7,173,289 B1    2/2007 Wu et al.
2003/0057417 A1* 3/2003 Lee et al. ................ H01L 35/24
                                                                257/40
(Continued)

FOREIGN PATENT DOCUMENTS

CN    1622727 A    6/2005
CN    1758819 A    4/2006
(Continued)

OTHER PUBLICATIONS

First Chinese Office Action, for Chinese Patent Application No. 201410418900.8, dated Aug. 26, 2016, 13 pages.
(Continued)

*Primary Examiner* — Matthew E. Gordon
(74) *Attorney, Agent, or Firm* — Kinney & Lange, P.A.

(57) ABSTRACT

The present disclosure provides an OLED pixel unit, a method for producing the same, a display panel and a display apparatus. The OLED pixel unit includes an organic light emitting diode configured to emit a light within a wavelength range; and a photonic crystal array located at a light exit side of the organic light emitting diode, structural parameters of the photonic crystal array depending on a preset color of the OLED pixel unit. The light emitted from the OLED has a wavelength which is selected by the photonic crystal array such that the preset color is presented at the light exit side of the OLED. It can achieve high resolution over the conventional means due to the photonic crystal array having a machining size in nanometers. Thus, the resolution of the OLED pixel unit using the photonic crystal array can be improved significantly.

16 Claims, 5 Drawing Sheets

(51) Int. Cl.
*H01L 51/56* (2006.01)
*H01L 51/52* (2006.01)

(52) U.S. Cl.
CPC ...... *H01L 27/3262* (2013.01); *H01L 27/3272* (2013.01); *H01L 51/5237* (2013.01); *H01L 51/56* (2013.01)

(56) References Cited

U.S. PATENT DOCUMENTS

| | | |
|---|---|---|
| 2007/0241326 A1 | 10/2007 | Kim et al. |
| 2009/0236597 A1* | 9/2009 | Ye ................. H01L 29/7869 257/43 |
| 2010/0091224 A1 | 4/2010 | Cho et al. |
| 2010/0219427 A1 | 9/2010 | Fukuda |
| 2010/0283068 A1* | 11/2010 | Buckley ............. H01L 27/322 257/89 |
| 2014/0231758 A1 | 8/2014 | Mok et al. |

FOREIGN PATENT DOCUMENTS

| | | |
|---|---|---|
| CN | 101569013 A | 10/2009 |
| CN | 10197637 A | 2/2011 |
| CN | 102272973 A | 12/2011 |
| CN | 103474434 A | 12/2013 |

OTHER PUBLICATIONS

International Search Report and Written Opinion from PCT Application Serial No. PCT/CN2014/089797, dated May 27, 2015, 13 pages.

Second Chinese Office Action, for Chinese Patent Application No. 201410418900.8, dated Feb. 28, 2017, 6 pages.

\* cited by examiner

OLED PIXEL UNIT WITH PHOTONIC CRYSTAL ARRAY AND METHOD OF PRODUCING THE SAME

BACKGROUND

Field of the Disclosure

The present disclosure relates to display field, and in particular, to an OLED pixel unit, a method of producing the same, a display panel and a display apparatus.

Description of the Related Art

An active matrix/organic light emitting diode (OLED) panel is a new display technique. In comparison with the conventional liquid crystal panel, the OLED panel has advantages, such as rapid reactive speed, high contrast, wide visual angle and the like. In addition, the OLED panel has a self-emission property without needing a backlight plate. Thus, the cost for the backlight module is saved and the OLED panel becomes thinner than the conventional liquid crystal panel. At present, the OLED panel has become a potential candidate of the next generation of display technology.

Currently, the OLED panel is substantially produced by processes for above 4 inches. The processes include small molecule evaporation (for example, a FMM process or a WCOA process), a solution printing process (for example, Ink-Jet Printing, Nozzle Printing), an evaporation-solution combination process and the like.

However, in the above processes, fineness is difficult to be controlled for producing a micro-size OLED panel, in particular, a high resolution product and a super high resolution product having a pixel size less than 50 μm, for example, a wearable display product. Now, an OLED device which can achieve high fineness is desired.

Further, an OLED assembly that can emit a preset color can be produced only by processes including, for example, small molecule Fine-Metal-Mask (FMM), evaporation, solution printing, evaporation-solution combination or the like. However, difficulty for performing these processes is high and costs of these processes are also high. The OLED cannot be made so small and cannot be used to achieve high resolution display.

SUMMARY OF THE DISCLOSURE

In view of the above problem in the prior art, the present disclosure provides an OLED pixel unit, a method for producing the same, a display panel and a display apparatus, which are capable of realizing high resolution display and super high resolution display.

In accordance with an aspect, it provides an OLED pixel unit, comprising:

an organic light emitting diode configured to emit a light within a wavelength range; and a photonic crystal array located at a light exit side of the organic light emitting diode, structural parameters of the photonic crystal array depending on a preset color of the OLED pixel unit, wherein the light emitted from the organic light emitting diode has a wavelength which is selected by the photonic crystal array such that the preset color is presented at the light exit side of the organic light emitting diode.

In an embodiment, the photonic crystal array is a three dimensional photonic crystal array.

In an embodiment, the photonic crystal array is a two dimensional photonic crystal array, which is a rectangular periodic structure, a rhombic periodic structure or a quasi-periodic structure, and wherein constitutive units of the two dimensional photonic crystal array are recesses, protrusions, or mixed structures composed of the recesses and the protrusions.

In an embodiment, the recess is a cylindrical hole or ball-shaped recess, and the protrusion is a cylindrical or ball-shaped protrusion.

In an embodiment, the two dimensional photonic crystal array is a rectangular periodic structure, and constitutive units of the two dimensional photonic crystal array are cylindrical hole recesses.

In an embodiment, the organic light emitting diode is a white organic light emitting diode.

In an embodiment, for the OLED pixel unit having the preset color of blue, the cylindrical hole recess has a diameter $D_1$ which meets: 245 nm≤$D_1$≤255 nm, and has a hole spacing $L_1$ in a X direction and a Y direction, which meets: 335 nm≤$L_1$≤345 nm; for the OLED pixel unit having the preset color of green, the cylindrical hole recess has a diameter $D_2$ which meets: 215 nm≤$D_2$≤225 nm, and has a hole spacing $L_2$ in the X direction and the Y direction, which meets: 135 nm≤$L_2$≤145 nm; or for the OLED pixel unit having the preset color of red, the cylindrical hole recess has a diameter $D_3$ which meets: 95 nm≤$D_3$≤105 nm, and has a hole spacing $L_3$ in the X direction and the Y direction, which meets: 295 nm≤$L_3$≤305 nm.

In an embodiment, the structural parameters of the photonic crystal array are calculated out by a plane wave method, a transfer matrix method or a finite element method.

In an embodiment, the OLED pixel unit further comprises: a substrate; a drive assembly formed on the substrate; and a passivation layer configured to be located above the drive assembly and cover the drive assembly, wherein the organic light emitting diode has an anode connected electrically to the drive assembly through a via hole on the passivation layer.

In an embodiment, the photonic crystal array is formed in the substrate, film layers which constitute the drive assembly, or the passivation layer.

In an embodiment, the photonic crystal array is formed in the passivation layer, and a part of material of the anode of the organic light emitting diode is charged in the photonic crystal array.

In an embodiment, the OLED pixel unit further comprises: a buffer layer formed between the substrate and the drive assembly, wherein the photonic crystal array is formed in the buffer layer.

In an embodiment, the drive assembly is a TFT assembly, a NMOS assembly, a PMOS assembly or a CMOS assembly.

In an embodiment, the TFT assembly is a bottom gate TFT assembly which comprises:

a gate electrode formed on the substrate;

a gate insulation layer formed above the gate electrode and a transparent substrate that is not covered by the gate electrode;

an active layer formed above the gate insulation layer;

an etch stop layer formed above the active layer; and a source electrode and a drain electrode formed on both sides of the etch stop layer and located above the active layer and the gate insulation layer that is not covered by the active layer, wherein the photonic crystal array is formed in any film layer of the gate electrode, the gate insulation layer, the active layer, the etch stop layer, the source electrode or the drain electrode.

In an embodiment, the organic light emitting diode comprises: a first electrode; a light emitting layer formed on the first electrode; a second electrode formed on the light emitting layer.

In an embodiment, the photonic crystal array is formed in a film layer of the first electrode or second electrode.

In accordance with another aspect, it also provides an OLED display panel, comprising one or more OLED pixel units as described above.

In accordance with a further aspect, it also provides a display apparatus comprising the OLED display panel as described above.

In accordance with a yet further aspect, it also provides a method for producing the OLED pixel unit as described above, the method comprising the steps of: forming an organic light emitting diode; and before forming the organic light emitting diode or during forming the organic light emitting diode, forming a photonic crystal array on the light exit side of the organic light emitting diode.

In an embodiment, one of the following processes is used to form the photonic crystal array: lithographic etching process, nanometer imprinting process, ion beam etching process, heat baking process, micro-ball spin-coating process, micro-ball printing process, nanometer particle spin coating process and nanometer particle printing process.

By means of the above solutions, the OLED pixel unit and the method for producing the same, the display panel and the display apparatus can achieve at least one of the following advantages:

(1) The photonic crystal array has a machining size in magnitude of nanometers, and has good monochromaticity and certain directionality. It may achieve high resolution over those realized by the conventional processes while keeping the conventional display effects and thus the resolution of the OLED pixel unit using the photonic crystal array may also be improved significantly to meet the application requirements of the OLED display panel having high resolution and super high resolution.

(2) For a white organic light emitting diode, the wavelength selection of the white light is achieved by the photonic crystal array and the white organic light emitting diode may be produced by using Open-Mask process with high precision, such that the difficulty for producing the high resolution display is transferred into the back plate from the organic light emitting diode. Thus, the difficulty for solving the high resolution display problem can be reduced significantly. The production process can be simplified significantly for the same resolution of display.

(3) The production process of the photonic crystal has been very mature and is compatible with the production processes of the conventional thin film transistor TFT and the organic light emitting diode, and thus it is easy to become popularized.

MAIN ELEMENTS

Figure 1:
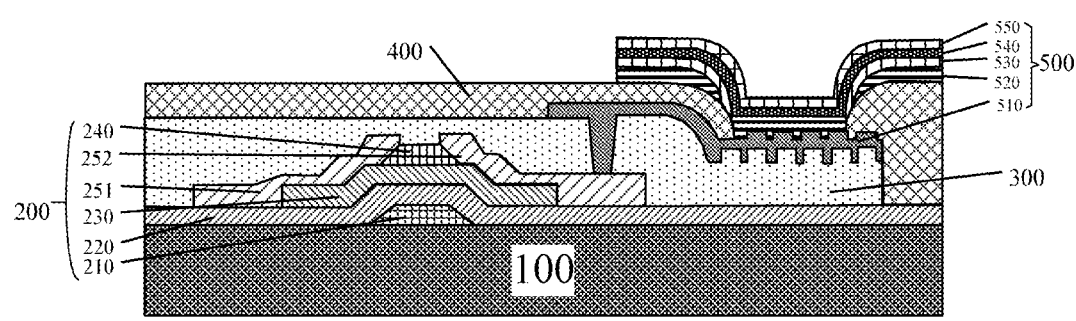
FIG. 1 shows schematically a structure of an OLED pixel unit according to an embodiment of the present invention.

| | | | |
|---|---|---|---|
| 100: | transparent substrate; | | |
| 200: | TFT assembly | | |
| 210: | gate electrode | 220: | gate insulation layer |
| 230: | active layer | 240: | etch stop layer |
| 251: | source electrode (or drain electrode) | 252: | drain electrode (or source electrode) |
| 261: | channel separation region | 211: | gate oxidation layer |
| 300: | passivation layer | | |
| 400: | pixel definition layer | | |
| 500: | white organic light emitting diode | | |
| 510: | anode | 520: | hole transport layer |
| 530: | light emitting layer | 540: | electron transport layer |
| 550: | cathode | | |

DETAILED DESCRIPTION OF THE PREFERRED EMBODIMENTS

In order that objects, solutions and advantages of the present disclosure will become more apparent and explicit, the embodiments will be described hereinafter in detail with reference to the accompanied drawings. It should be noted that same reference numerals represent same or similar parts throughout drawings or description. The solutions that are known by the skilled person in the art are not shown or illustrated. Further, although the present disclosure may provide examples of parameters including specific values, it should be known that the parameters need not to be equal exactly to the corresponding values, but may approximate to the corresponding values within an acceptable tolerance limit or the design constraint. The terms regarding directions referred in the embodiment, for example, "up", "down", "front", "behind", "left", "right" or the like, only mean the directions in the figures. Therefore, these terms are given by ways of examples, instead of limiting the scope of the present invention.

In addition, in the following description, details of embodiments are expounded concretely for explanation.

However, it is noted that one or more embodiments may be implemented without explanations in details by those skilled in the art. In any other case, the known structures and devices are shown schematically to simplify the accompanying drawings.

In accordance with the general concept of the present disclosure, it provides an OLED pixel unit, comprising: an organic light emitting diode configured to emit a light within a wavelength range; and a photonic crystal array located at a light exit side of the organic light emitting diode, wherein structural parameters of the photonic crystal array depends on a preset color of the OLED pixel unit, wherein the light emitted from the organic light emitting diode has a wavelength which is selected by the photonic crystal array such that the preset color is presented at the light exit side of the organic light emitting diode.

In order to understand the present disclosure better, the concept of the photonic crystal will be explained below. The photonic crystal is a specific crystal lattice structure that can react to a light. As ions are periodically presented at nodes of crystal lattice (sites of respective atoms) in semiconductor material, the photonic crystal is the material in which low refractivity (for example, caused by artificial air cavities) occurs periodically at certain sites of the high refractivity material. The periodic structure formed by alternative arrangement of the high refractivity material and the low refractivity material may produce photonic crystal band gaps (similar to forbidden band in the semiconductor). The photonic crystal can modulate electromagnetic waves having corresponding wavelengths. When the electromagnetic waves travel in the photonic crystal structure, the electromagnetic waves are modulated due to presence of Bragg scattering and thus the electromagnetic energy forms an energy band structure. There is a band gap, that is, a photonic band gap, between the energy bands. All of photons that have energy falling within the photonic band gap cannot enter the crystal. The distance between periodically arranged low refractivity sites is constant in magnitude, which causes that the photonic crystal with certain distance can produce energy band effects only for optical waves having certain frequencies. That is, only the light with certain frequencies may be completely forbidden to travel within the photonic crystal having constant period.

The present disclosure allows the light having all the wave bands other than special wave bands (for example, red light wave band, green light wave band or blue light wave band, but not being limited to these) to be forbidden to travel in the designed photonic crystal, by designing the structural parameters of photonic crystal reasonably, i.e., the periodic arrangement of the optical material with size of 100 nm to 1 µm, such that the function of shielding a certain color can be achieved.

In an embodiment of the present invention, it provides an OLED pixel unit which includes an organic light emitting diode configured to emit a light within a wavelength range; and a photonic crystal array formed at a light exit side of the organic light emitting diode (or the photonic crystal array is arranged in the light emitting path of the organic light emitting diode), and wherein structural parameters of the photonic crystal array depends on a preset color of the OLED pixel unit, wherein the light emitted from the organic light emitting diode has a wavelength which is selected by the photonic crystal array such that the preset color is presented at the light exit side of the organic light emitting diode (after the light emitted from the organic light emitting diode passes through the photonic crystal array).

As an example, the photonic crystal array may be a two dimensional photonic crystal array or a three dimensional photonic crystal array. Generally, the material constituting the photonic crystal array is all kinds of insulation materials, for example, inorganic insulation materials, organic insulation materials or composite insulation materials. The light exit side is the side of the OLED from which the light is emitted. The light emitting mode may include a top-emitting mode, a bottom-emitting mode and a double-side emitting mode.

As the machining dimension of the photonic crystal array is in magnitude of nanometer, the resolution of the OLED pixel unit including the photonic crystal array may also be improved significantly to meet the requirement of application of high resolution and super high resolution OLED display panel.

In an embodiment of the present invention, it provides an OLED pixel unit. FIG. 1 shows schematically a structure of an OLED pixel unit according to an embodiment of the present invention. With reference to FIG. 1, the embodiment is an OLED pixel unit using the two dimensional photonic crystal. It includes a transparent substrate 100, a TFT assembly 200 formed on the transparent substrate 100, and a passivation layer 300 laid above the TFT assembly 200. The passivation layer in the preset pixel region is etched to form the two dimensional photonic crystal array. The period and unitary structure size of the two dimensional photonic crystal array are determined by the preset color of the OLED pixel unit. The OLED pixel unit further includes a pixel definition layer 400 formed above the passivation layer 300 and forming a pixel region by etching, and a white-light organic light emitting diode 500 formed in the pixel region defined by the pixel definition layer 400.

In an example, the preset color means the color that is desired to be presented by the OLED pixel unit in the panel design phase. For example, if the OLED pixel unit is a red pixel, the preset color will be red; if the OLED pixel unit is a blue pixel, the preset color will be blue, and so on.

With reference to the direction represented by arrows shown in the FIG. 1, a white light is emitted from the white-light organic light emitting diode 500, and is subject to wavelength selection by the photonic crystal array on the passivation layer 300. The preset color may be seen from the backside of the transparent substrate.

The various parts constituting the OLED pixel unit having the two dimensional photonic crystal according to the embodiment will be explained below in details.

(1) Transparent Substrate

In the embodiment, the transparent substrate 100 is a glass substrate, but embodiments of the present invention are not limited to this. In the embodiments of the present invention, the transparent substrate 100 may also be other substrates, such as quartz, monocrystalline silicon, plastic film or the like.

(2) TFT Assembly

Figure 2:
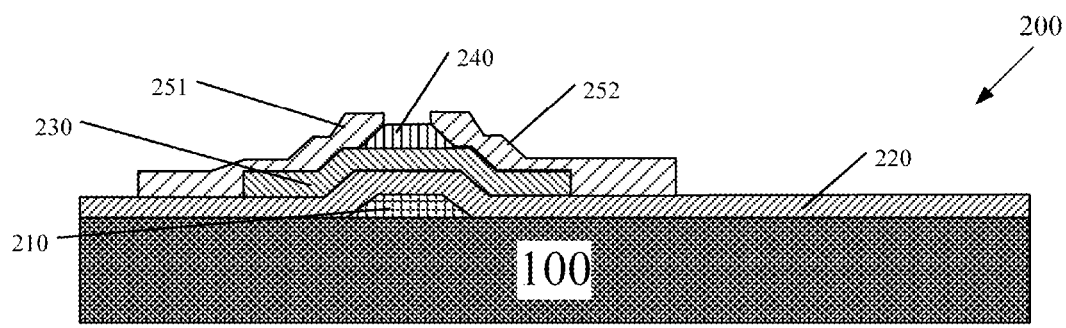
FIG. 2 shows schematically a structure of a TFT assembly in the OLED pixel unit shown in FIG. 1.

FIG. 2 shows schematically a structure of the TFT assembly in the OLED pixel unit shown in FIG. 1.

In the embodiment, the TFT assembly has a bottom gate structure. With reference to FIGS. 1 and 2, the TFT assembly 200 includes: a gate electrode 210 formed on the transparent substrate 100; a gate insulation layer 220 formed above the gate electrode 210 and the transparent substrate 100 that is not covered by the gate electrode 210; an active layer 230 formed above the gate insulation layer 220; an etch stop layer 240 formed above the active layer 230; a source electrode 251 and a drain electrode 252 formed on both sides of the etch stop layer 240 and located above the active layer 230 and the gate insulation layer 220 that is not covered by the active layer 230.

It should be noted that a buffer layer (not shown) may also be provided between the gate electrode 210 and the substrate 100, so as to further prevent diffusion of various elements in the glass substrate toward the TFT assembly and thus to prevent the device from being degraded or failing In the embodiment, the buffer layer is a $SiO_2$ layer of 200-2000 nm.

In the embodiment, the gate electrode 210 is a molybdenum (Mo) layer of 200-2000 nm, but embodiments of the present invention are not limited to this. The gate electrode 210 may also be a film with thickness of 1 nm~500 nm, made from one or more of the following materials: epitaxial silicon, metal material and composite conductive material. In an example, the metal material is an elementary substance of the following materials or alloy material made from two or more of the following materials: Mo, Al, Cr.

In the embodiment, the gate insulation layer 220 is a $SiO_2$ layer of 150~4000 nm, but embodiments of the present invention are not limited to this. The gate insulation layer 220 may also be an insulation material layer such as a thermal silicon oxide layer, a silicon nitride ($Si_3N_4$) layer or a silicon oxynitride layer, with a thickness of 1 nm~100 nm. In an example, the thermal silicon oxide layer or the silicon nitride ($Si_3N_4$) layer may be deposited and produced by a CVD process.

In the embodiment, the active layer 230 is an indium gallium zinc oxide (IGZO) layer of 50~2000 nm, but embodiments of the present invention is not limited to this. The active layer 230 may also be an amorphous silicon layer, a monocrystalline silicon layer, a low temperature polycrystalline silicon layer, an organic semiconductor layer or other oxide active layers, with a thickness of 5 nm~200 nm. The low temperature polycrystalline silicon layer herein means a polycrystalline silicon layer formed below 500□ by LTPS process.

In the embodiment, the etch stop layer 240 is a $SiO_2$ layer of 50 nm. However, embodiments of the present invention are not limited to this. The etch stop layer 240 may also be a $SiO_2$ layer with a thickness of 10 nm~100 nm. In an example, the etch stop layer 240 functions to prevent the active layer 230 to be damaged due to wet etching of the source/drain electrode, that is, prevent drill etching.

In the embodiment, the source electrode and drain electrode are Mo/Al layers, but embodiments of the present invention are not limited to this. The source electrode and drain electrode may also be metal material layers, alloy material layers and other composite conductive material layers made from, for example, Ti, Cr and Au/Ti, with a thickness of 1 nm~500 nm. Furthermore, the positions of the source electrode and the drain electrode may be interchanged with each other. The details will be omitted below.

It should be noted that in the embodiment, the TFT assembly is used as a drive assembly, but embodiments of the present invention are not limited to this. Besides the TFT assembly, NMOS assembly, PMOS assembly or CMOS assembly may also be used as the drive assembly to realize the technical solution of the present disclosure. In an example, the TFT assembly may be an IGZO-TFT assembly, LTPS TFT or α-Si TFT assembly. The NMOS assembly may be a monocrystalline silicon NMOS assembly. The PMOS assembly may be a monocrystalline silicon PMOS assembly. The CMOS assembly may be a monocrystalline silicon CMOS assembly.

(3) Passivation Layer

Referring to FIG. 1, the passivation layer 300 is laid above the TFT assembl 200.

In the embodiment, the passivation layer 300 is a $SiO_2$ layer of 100 nm, but embodiments of the present invention are not limited to this. The passivation layer may also be other insulation material layers with a thickness of 1 nm~500 nm, such as silicon nitride ($Si_3N_4$) layers. A pixel region is preset in the passivation layer 300 to form the two dimensional photonic crystal array in periodic arrangement. The parameters of the two dimensional photonic crystal array depend on the preset color of the preset pixel region. Through the two dimensional photonic crystal array, the color selection of a white light, i.e., wavelength selection is achieved.

In the embodiment, the period of the two dimensional photonic crystal array depends on the preset color of the preset pixel region. During producing the two dimensional photonic crystal array, the parameters such as period of the photonic crystal array or shape and radius of constitutive units thereof are calculated in accordance with the preset colors, and then perforation is performed above the passivation layer by dry etching to form the photonic crystal array.

In an embodiment of the present invention, related parameters of the photonic crystal array may be calculated for example by the Plane Waves Method (PWM), the Transfer Matrix Method (TMM), the Finite Element Method (FEM). Typically, the basic formula used is Maxwell equations:

$$\nabla \cdot \vec{D}(\vec{r}, t) = \rho(\vec{r}, t) \qquad (1)$$

$$\nabla \cdot \vec{B}(\vec{r}, t) = 0$$

$$\nabla \times \vec{H}(\vec{r}, t) = \frac{\partial \vec{D}(\vec{r}, t)}{\partial t} + \vec{J}(\vec{r}, t)$$

$$\nabla \times \vec{E}(\vec{r}, t) = -\frac{\partial \vec{B}(\vec{r}, t)}{\partial t}$$

All of parameters in the Maxwell equations are well-known by one skilled in the art. The details will be omitted herein.

For the Plane Waves Method (PWM), it starts directly from the Maxwell equations of the photonic crystal, and directly derives Bloch solutions and frequencies by diagonalizing an eigen operator. It has significant characteristics of resolving a degenerate mode and achieving a high operation speed. The band gap structures of an ideal two dimensional photonic crystal with different crystal lattices may be calculated by the PWM to provide a theory foundation for explaining measurements. In view of this, frequency and field distribution of defect modes and the band gap structure of the photonic crystal having a definite number of defects may be calculated by means of Phase shift theorem in Fourier Transformation.

For the Finite Difference Time Domain (FDTD) method, it discretizes a time domain and a space domain. The law of propagation and evolution of electromagnetic waves with time may be calculated. It may be adapted to any complex interfaces, but has a relatively low operation speed. FDTD calculation may be used to analyze the transmission characteristics of the photonic crystal, quality factor and mode volume of a micro-resonant cavity inner-mode or the like.

For the Transfer Matrix Method (TMM), it is spread by an electromagnetic field at solid spatial grid point positions to convert the Maxwell equations into the form of transfer matrix and convert the problem into a problem of solving eigen values. The transfer matrix represents relation between a field intensity of a layer of grid points and a field intensity of another adjacent layer of grid points. It assumes that there are same states and same frequencies on the same layer of grid points in a constitute space. In this way, the Maxwell equations can be used to extrapolate the field from a position to an entire crystal space. The transfer matrix may calculate reflective indexes and transmissive indexes conveniently. However, for complex structures, the transfer matrix becomes too large and the amount of calculation also becomes increased significantly.

At present, various commercial software for calculating the photonic crystal array structure have been developed, such as Comsol, Bandsolve and Crystal wave. The embodiments of the present invention produce the two dimensional photonic crystal array preferably by using the commercial software to calculate the structural parameters of the photonic crystal array and verifying them by a practical process, so as to improve efficiency and reduce errors.

The skilled person in the art should know that the parameters of the photonic crystal array are divided into two types: the first type of parameters are periodic parameters having periodic arrangement and periods in various directions; the second type of parameters are shape and size in various directions of one unit (called as constitutive unit) constituting the photonic crystal array.

Figure 3A:
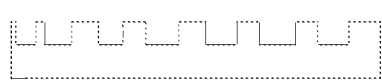
FIG. 3A and FIG. 3B are cross-sectional view and three dimensional view of a photonic crystal array on a passivation layer in the OLED pixel unit shown in FIG. 1, respectively.
Figure 3B:
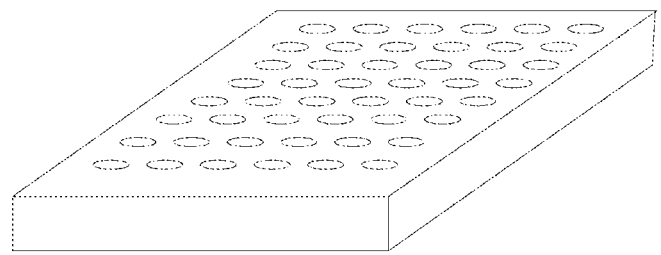

FIG. 3A and FIG. 3B are cross-sectional view and three dimensional view of the photonic crystal array on the passivation layer in the OLED pixel unit shown in FIG. 1. As illustrated in FIGS. 3A and 3B, the embodiment uses the photonic crystal array in two dimensional rectangular periodic structure. Its constitutive unit is a cylindrical hole recess.

In the embodiment, the structural parameters of the photonic crystal array are calculated by using the commercial software Comsol. The resultant respective parameters of the photonic crystal array are provided as follows:

(1) for the OLED pixel unit having the preset color of blue, the cylindrical hole recess has a diameter $D_1$ which meets: 245 nm≤$D_1$≤255 nm, and has a hole spacing $L_1$ in X direction and Y direction, which meets: 335 nm≤$L_1$≤345 nm;

(2) for the OLED pixel unit having the preset color of green, the cylindrical hole recess has a diameter $D_2$ which meets: 215 nm≤$D_2$≤225 nm, and has a hole spacing $L_2$ in X direction and Y direction, which meets: 135 nm≤$L_2$≤145 nm; or (3) for the OLED pixel unit having the preset color of red, the cylindrical hole recess has a diameter $D_3$ which meets: 95 nm≤$D_3$≤105 nm, and has a hole spacing $L_3$ in X direction and Y direction, which meets: 295 nm≤$L_3$≤305 nm.

Regarding the depth of the cylindrical hole of the constitutive unit of the two dimensional photonic crystal array, it may be adjusted as required as long as it does not go beyond the thickness of the passivation layer.

In the embodiment, the constitutive unit is a cylindrical hole, but embodiments of the present invention are not limited to this. The constitutive unit may also be a recess, a protrusion, or a mixed structure composed of the recess and the protrusion, other than the hole. In addition, besides the periodic structure in rectangular arrangement, the periodic structure of the photonic crystal array may also be a rhombic periodic structure, a quasi-periodic structure or the like. The quasi-periodic structure herein means a structure that does not have a rigorous periodicity, but may be regarded as a periodic structure after certain approximation is induced.

Figure 4A:
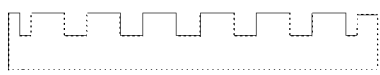
FIG. 4A and FIG. 4B are cross-sectional view and three dimensional view of a cylindrical protrusion photonic crystal on a passivation layer in the OLED pixel unit according to another embodiment of the present invention, respectively.
Figure 4B:
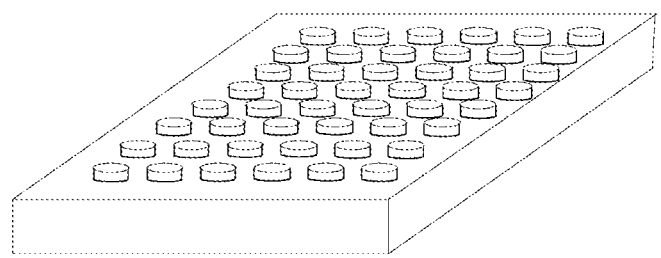

In another embodiment of the present invention, the constitutive unit in the photonic crystal array may also have a shape of cylinder, as shown in a cross-sectional view of FIG. 4A and in a three dimensional view of FIG. 4B.

Figure 5A:
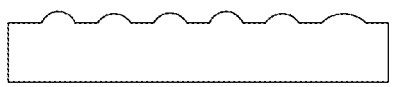
FIG. 5A and FIG. 5B are cross-sectional view and three dimensional view of a spherical protrusion photonic crystal on a passivation layer in the OLED pixel unit according to another embodiment of the present invention, respectively.
Figure 5B:
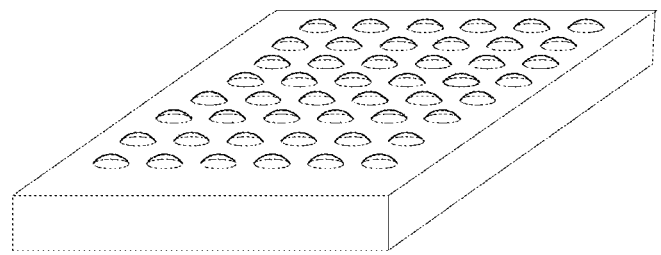

In a further embodiment of the present invention, the constitutive unit in the photonic crystal array may also have a shape of spherical protrusion, as shown in a cross-sectional view of FIG. 5A and in a three dimensional view of FIG. 5B.

Figure 6A:
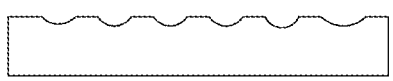
FIG. 6A and FIG. 6B are cross-sectional view and three dimensional view of a spherical recess photonic crystal on a passivation layer in the OLED pixel unit according to another embodiment of the present invention, respectively.
Figure 6B:
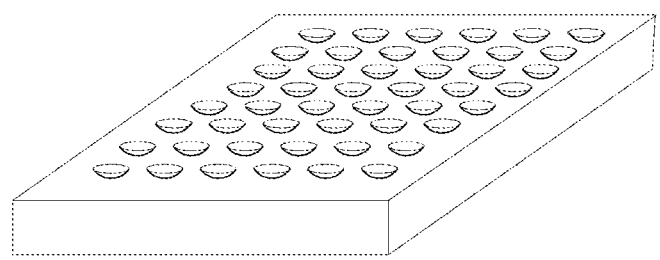

In a further embodiment of the present invention, the constitutive unit in the photonic crystal array may also have a shape of spherical recess, as shown in a cross-sectional view of FIG. 6A and in a three dimensional view of FIG. 6B.

(4) Pixel Definition Layer

The pixel definition layer 400 is formed above the passivation layer 300 to define the pixel regions to produce the white-light organic light emitting diode.

In the embodiment, the pixel definition layer 400 is acrylic material of 1.5 μm, but embodiments of the present invention are not limited to this. The pixel definition layer 400 may also be a film layer made of other resin material with a typical thickness of 0.5 μm~3 μm.

In an example, the substrate 100, the TFT assembly 200, the passivation layer 300 and the pixel definition layer 400 together constitute a TFT back plate. Then, the white-light organic light emitting diode will be produced on the TFT back plate.

(5) White-light Organic Light Emitting Diode

The white-light organic light emitting diode 500 has a thickness of 60 nm~1000 nm in its entirety, and may have One Unit structure or Tandem structure. The organic light emitting diode includes: a first electrode; a light emitting layer formed on the first electrode; and a second electrode formed on the light emitting layer. The first electrode may be an anode or a cathode. If the first electrode is the anode, the second electrode will be the cathode. If the first electrode is the cathode, the second electrode will be the anode. In order to enhance certain performance of the OLED, the organic light emitting diode may further include other film layers, which details will be omitted herein.

Figure 7:
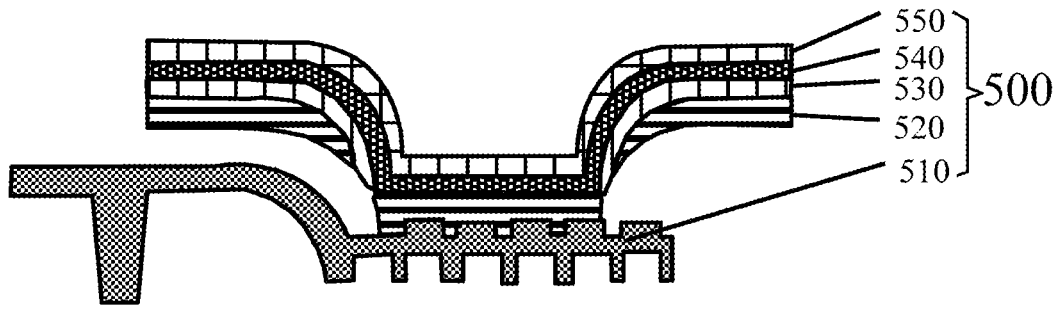
FIG. 7 shows schematically a structure of a white organic light emitting diode in the OLED pixel unit shown in FIG. 1.

In an example that the first electrode is the anode and the second electrode is the cathode, FIG. 7 shows schematically a structure of a white-light organic light emitting diode in the OLED pixel unit shown in FIG. 1. With reference to FIGS. 1 and 7, the main body part of the white-light organic light emitting diode 500 is formed in the pixel region, and includes: an anode 510 formed in the pixel region and connected electrically to a drain electrode of the drive assembly by a via hole formed by etching on the passivation layer 300; a light emitting layer formed on the anode 510; a cathode 550 formed on the light emitting layer.

It should be noted that the pixel definition layer 400 is formed after the anode 510 is formed.

The anode 510 may also be called as a pixel electrode layer. With reference to FIGS. 1 and 7, the anode 510 is formed above the passivation layer 300. The main body part of the anode 510 is formed in the preset pixel region. The anode 510 has an end electrically connected to a drain electrode 252 of the TFT assembly 200 by a via hole formed by etching on the passivation layer 300. Part of material of the anode 510 is filled into the photonic crystal array above the passivation layer.

In the embodiment, the OLED includes a hole transport layer 520, a light emitting layer 530 and an electron transport layer 540 sequentially deposited on the anode 51.

In the embodiment, the anode 510 is a ITO (indium tin oxide) layer of 100 nm, but embodiments of the present invention are not limited to this. The anode 510 may also be a conductive film layer made from other conductive material, for example, amorphous or polycrystalline graphene material layer. The anode has a thickness $h_2$, which meets 1 nm≤$h_2$≤500 nm.

In the embodiment, the hole transport layer 520 is a NPB (N,N'-diphenyl-N-N'-di(1-naphthyl)-1,1'-biphenyl-4,4'-diamine) layer, but embodiments of the present invention are not limited to this. The hole transport layer 520 may also be a film made from other aromatic amine material with a thickness of 1 nm~100 nm, for example, TPD (N,N'-diphenyl-N-N'-di(3-methylphenyl)-1,1'-biphenyl -4,4'-diamine).

In the embodiment, the light emitting layer 530 is a layer of CBP: (ppy)$_2$Ir(acac), a layer of CBP: Flrpic and a layer of CBP: Btp2Ir(acac), with a thickness of 25 nm. These three layers emit green light/blue light/red light respectively such that the entire device emits a white light. However, embodiments of the present invention are not limited to this. The light emitting layer 530 may also be a film layer produced by macromolecules, metal complexes or micro-molecule organic flourescent or phosphorescent material with a thickness of 1 nm~100 nm. Some micro-molecule materials, such as Aluminium 8-hydroxyquinoline (AlQ), coumarin, or rubrene may be used to achieve various light emitting wavelengths.

It should be noted that the embodiments of the present invention may also use other forms of white light emitting diode, for example, the white light emitting diode having other forms of light emitting layer. They also may be used to achieve the embodiments of the present invention. The skilled person in the art should know these forms of organic light emitting diodes. The specific explanations to these forms will be omitted herein.

In the embodiment, the electron transport layer 540 is a Aluminium 8-hydroxyquinoline (AlQ) layer with a thickness of 30 nm~70 nm. However, embodiments of the present invention are not limited to this. The electron transport layer 540 may also be an organic material layer with low LUMO energy levels, for example, Bphen of 6 nm/80 nm.

In the embodiment, the cathode 550 is a LiF/Al layer of 5 nm~10 nm. The LiF layer has a thickness of 5 nm-10 nm. The Al layer has a thickness of 100 nm~300 nm. However, embodiments of the present invention are not limited to this. The cathode 550 may also be a film produced from a metal having a low work function, such as Mg: Ag and alloy thereof, with a thickness of 5 nm~50 nm.

The skilled person in the art should know that in certain white-light organic light emitting diodes, its upper electrode is the cathode and its lower electrode is the anode. The light emitting layer is also located between the cathode and the anode. Such arrangement is similar to the white light emitting diode in the embodiment, and also falls within the protection scope of the present invention. The specific explanations will be omitted herein.

In the embodiment, the wavelength selection of the white-light organic light emitting diode is achieved by the photonic crystal array. It is not necessary for the organic light emitting diode itself to achieve high resolution display. The difficulty of achieving high resolution display is transferred to the back plate from the organic light emitting diode, thereby reducing the difficulty of solving the high resolution display problem significantly.

Although in the above embodiments, the photonic crystal array is arranged in the passivation layer, embodiments of the present invention are not limited to this. In an example, the photonic crystal array may be located in any film layers on the light exit side of the organic light emitting diode, for example, may be arranged in the same layer as the gate electrode, the gate insulation layer, the active layer, the etch stop layer, the source electrode or the drain electrode layer.

In an embodiment of the present invention, it also provides a display panel including one or more OLED pixel unit as described in any one of the above embodiments.

The OLED pixel unit includes: an organic light emitting diode emitting a light over a wavelength range; a photonic crystal array formed on a light exit side of the organic light emitting diode and having structural parameters which depend on the preset color of the OLED pixel unit. The light emitted from the organic light emitting diode has a wavelength which is selected by the photonic crystal array such that the preset color is presented on the light exit side of the organic light emitting diode (through the photonic crystal array).

On the display panel, the OLED pixel units are arranged in array. The photonic crystal array having different wavelength selection functions is arranged in a periodic array as the corresponding organic light emitting diodes do. In this way, by means of the wavelength selection effects of the photonic crystal, the full-color display is achieved.

The skilled person in the art should know the relation between the display panel according to the embodiment and a single OLED pixel unit very well. The specific explanations will be omitted herein.

In an embodiment of the present invention, the display panel may further include one or more OLED pixel units according to any one of subsequent embodiments. It has the same composition and principle as the embodiment. The specific explanations will be omitted herein.

The display apparatus may be any product or component having display function, such as an OLED display panel, a cell phone, a tablet computer, a TV, a display, a notebook computer, a digital camera frame, a navigator and the like.

In an embodiment of the present invention, it also provides a display apparatus including the display panel as described in any one of the above embodiments.

In addition, in an embodiment of the present invention, the display panel included in the display apparatus may further be composed of the OLED pixel units as described in any one of the subsequent embodiments.

Figure 8:
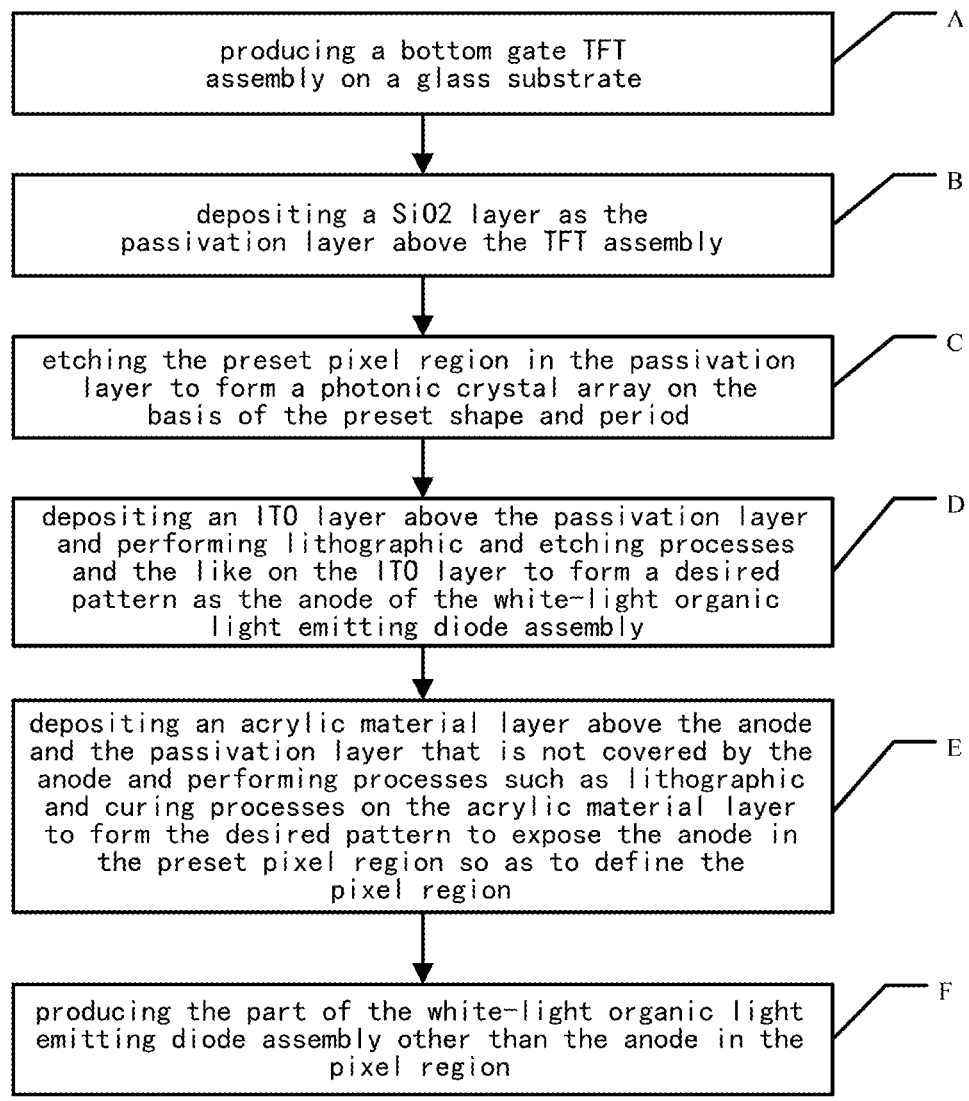
FIG. 8 is a flow chart of a method for producing an OLED pixel unit according to an embodiment of the present invention.
Figure 9:
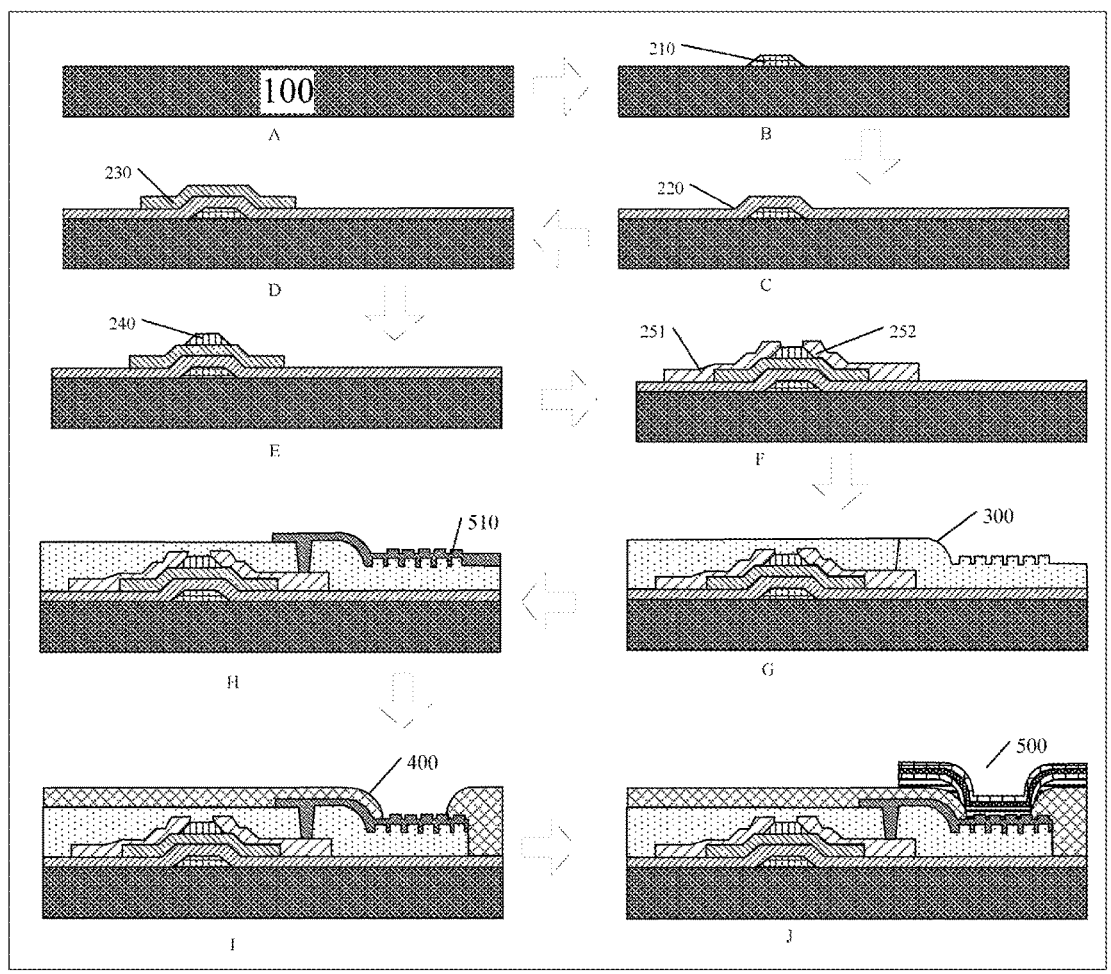
FIG. 9 is a schematic cross-sectional view of the device obtained after the respective steps in the method shown in FIG. 8.

In a further embodiment of the present invention, it also provides a method for producing an OLED pixel unit. FIG. 8 is a flow chart of a method for producing an OLED pixel unit according to an embodiment of the present invention. FIG. 9 is a schematic cross-sectional view of devices obtained after the respective steps in the method shown in FIG. 8. With reference to FIGS. 8 and 9, the method for producing an OLED pixel unit according to the embodiment may include steps A-F.

Step A: producing a bottom gate TFT assembly on a glass substrate.

The step A for producing the TFT assembly may in particular include sub-steps A0-A6. In these sub-steps, Sub-step A0: cleaning the glass substrate.

In this step, the cleaning method may be a standard method for cleaning a substrate. The cleaned glass substrate is illustrated in FIG. 9A.

Besides the glass substrate, various substrates, such as quartz, monocrystalline silicon, plastic film and the like, may be used.

Sub-step A1: depositing a SiO$_2$ film with a thickness of 200-2000 nm as a buffer layer on the glass substrate by a CVD method.

Sub-step A2: depositing a Mo layer of 200 nm on the buffer layer by sputtering process and producing the desired gate electrode 210 by a lithographic step, an etching step and the like, as shown by B in FIG. 9.

In an embodiment of the present invention, the gate electrode 210 may also be a film made from one or more of the following materials, with a thickness of 1 nm~500 nm: epitaxial silicon, metal material and composite conductive material. In an example, the metal material is an elementary substance selected from the following materials, or an alloy composed of two or more materials selected from the following materials: Mo, Al, Cr.

Sub-step A3: depositing a $SiO_2$ layer of 150 nm as a gate insulation layer 220 at 370° C. by the CVD process, as illustrated by C in FIG. 9.

In the embodiment of the present invention, the gate insulation layer 220 may also be an insulation material layer, such as a thermal silicon oxide layer, a silicon nitride ($Si_3Ni_4$) layer or a silicon oxynitride layer, with a thickness of 1 nm~100 nm. The thermal silicon oxide layer or the silicon nitride ($Si_3Ni_4$) layer may be produced by the CVD process.

Sub-step A4: depositing an IGZO film layer of 50 nm by a sputtering process and forming a channel region by etching to form an active layer 230, illustrated by D in FIG. 9.

In an embodiment of the present invention, the active layer 230 may also be an amorphous silicon layer, a monocrystalline silicon layer, a low temperature polycrystalline silicon layer, an organic semiconductor layer or another oxide active layer with a thickness of 5 nm~200 nm.

Sub-step A5: depositing a layer of $SiO_2$ of about 50 nm above the active layer 230 and forming an etch stop layer 240 by a lithographic process, an etching process and the like, as illustrated by E in FIG. 9.

In an embodiment of the present invention, the etch stop layer 240 may also be a $SiO_2$ layer with a thickness of 10 nm~100 nm.

Sub-step A6: forming a source electrode and a drain electrode made from Mo/Al above the active layer 230 and the gate insulation layer 220 that is not covered by the active layer 230 on both sides of the etch stop layer 240, as illustrated by F in FIG. 9.

In an embodiment of the present invention, the source electrode and the drain electrode may also be made from a metal material layer, an alloy material layer or other composite conductive material layers, such as Ti, Cr and Au/Ti, with a thickness of 1nm~500 nm. Further, the positions of the source electrode and the drain electrode may be interchanged.

It should be noted that the active layer in the TFT back plate assembly may be necessarily doped and activated as required. For the top gate process, the doping and activation processes are both performed after the gate electrode is finished. For the bottom gate process, the doping and activation processes are both performed after the passivation layer or the planarization layer is finished. These processes are well-known in the art. The specific explanations will be omitted herein.

Step B: depositing a $SiO_2$ layer of about 100 nm as the passivation layer above the TFT assembly.

In an embodiment of the present invention, the passivation layer may also be another insulation material layer with a thickness of 1 nm~500 nm, for example, a silicon nitride ($Si_3N_4$) layer.

Step C: etching the preset pixel region in the passivation layer to form a two dimensional photonic crystal array, which has a period and a unit structure size depending on the preset color of the current OLED pixel unit, as illustrated by G in FIG. 9.

Typically, the process for producing the two dimensional photonic crystal array on the passivation layer uses lithographic and etching processes, that is, producing a mask at first by lithography, and then etching the passivation layer in the preset pixel region directly by the mask to form the two dimensional photonic crystal array. The process for producing the two dimensional photonic crystal array on the passivation layer may also use a direct etching process, that is, etching the passivation layer in the preset pixel region directly to form the two dimensional photonic crystal array.

In addition, the process for producing the two dimensional photonic crystal array on the passivation layer may also use a nanometer imprinting process, an ion-beam etching process, and a thermal baking process. The ion-beam etching process is very different from the conventional lithographic process. The lithographic process uses a light beam to pattern the mask with a precision of tens of nanometers while the ion-beam etching process uses an ion beam with a higher precision of up to about 10 nm. The thermal baking process means directly baking the photo resist after patterning it such that the photo resist is melt into a certain shape such as a elliptical shape, instead of forming the array by an etching process. In addition, for special materials, processes, such as a spin coating process or a printing process using a micro-balls or nanometer particles-containing solution may also be used.

Related parameters of the photonic crystal array have been described in details. Thus, the explanations to them will be omitted herein.

Step D: depositing an ITO layer of about 100 nm above the passivation layer and performing lithographic and etching processes and the like on the ITO layer to form a desired pattern as the anode of the white-light organic light emitting diode, the white-light organic light emitting diode having a main body part formed in the io preset pixel region, the main body part having an end electrically connected to the drain electrode of the TFT assembly through a via hole formed by etching in the passivation layer, as illustrated by H in FIG. 9.

In an embodiment of the present invention, the anode 510 may also be a conductive film layer made from other conductive materials, for example, an amorphous or polycrystalline graphene material layer. The anode has a thickness $h_2$, which meets $1 nm \leq h_2 \leq 500 nm$.

It should be noted that the anode needs to produce the corresponding pattern by etching. The shape of the pattern and the method for producing the pattern are both well-known in the art. The specific explanation to them will be omitted herein.

Step E: depositing an acrylic material layer of 1.5 μm above the anode and the passivation layer that is not covered by the anode and performing lithographic and curing processes and the like on the acrylic material layer to form the desired pattern to expose the anode in the preset pixel region so as to define the pixel region, as illustrated by I in FIG. 9.

In an embodiment of the present invention, the pixel definition layer may also be a film layer made from other resin materials, typically with a thickness of 0.5 μm~3 μm.

After forming the pixel definition layer, the TFT back plate assembly is finished.

Step F: producing the part of the white-light organic light emitting diode other than the anode 510 in the pixel region, as illustrated by J in FIG. 9.

It should be noted that, before the other part of the white-light organic light emitting diode is produced, a surface of the TFT back plate is processed by $O_2$ plasma to further reduce the surface work function of the anode ITO while passviating a surface part of the ITO layer.

The step F in particular may include: thermally evaporating a hole transport layer, an organic light emitting layer (the production temperature is about 190° C.), an electron transport layer (the production temperature is about 170° C.) and a cathode (the production temperature is about 900° C.) in sequence at vacuum of $1\times10^{-5}$ Pa.

In the embodiment, the hole transport layer is made from NPB (N,N'-diphenyl-N-N'-di(1-naphthyl)-1,1'-biphenyl-4,4'-diamine), with a thickness of 30 nm~70 nm. The green, blue and red light emitting layers are made from 25 nm thick main is material CBP: $(ppy)_2Ir(acac)$, CBP: Flrpic and CBP: Btp2Ir(acac), doped with Phosphorescent material. The electron transport layer is made from Aluminium 8-hydroxyquinoline (AlQ) with a thickness of about 30 nm~70 nm. The cathode is a LiF/Al layer, with an evaporation velocity of 1_nm/min. In an example, the LiF has a thickness of 5 nm~10 nm, and the Al layer has a thickness of 100 nm~300 nm.

In the embodiment of the present invention, other forms or materials of the light emitting layer, the cathode and the anode may also be used. The specific explanations to them will be omitted herein.

In the embodiment, the organic materials and the cathode metal thin layer are evaporated thermally in a high vacuum evaporation system deposited with an OLED/EL-organic metal film.

In addition, in the embodiment, a surface treatment may be applied to a pixel region film before depositing the hole transport layer as required and an electrode modification layer, a hole injection layer, an electron injection layer and the like, if required, may be added into the white-light organic light emitting diode, and surface modification and the like may be used to produce the anode of the white-light organic light emitting diode. All of them are the conventional technical means in the prior art. The specific explanations to them will be omitted herein.

In another embodiment of the present invention, it also provides another OLED pixel unit including the two dimensional photonic crystal. The OLED pixel unit in the embodiment is distinguished from the OLED pixel unit shown in FIG. 1 in that the drive assembly uses a MOS(metal-oxide-semiconductor) arrangement with monocrystalline silicon as its substrate.

Figure 10:
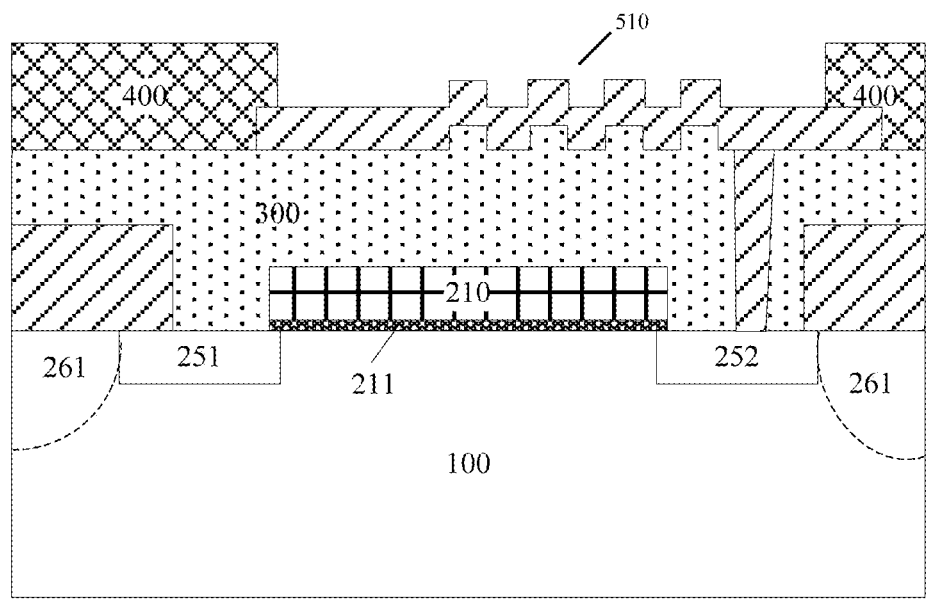
FIG. 10 shows schematically a structure of an anode in the light emitting diode and a back plate in an OLED pixel unit according to an embodiment of the present invention.

FIG. 10 shows schematically a structure of an anode in the light emitting diode and a back plate in an OLED pixel unit according to an embodiment of the present invention. As illustrated in FIG. 10, the back plate in the embodiment includes:

a substrate 100, made from monocrystalline silicon;

a MOS assembly 200 formed in a region defined by channel interruption regions 261 and including a channel region formed between the channel interruption regions, a gate oxidation layer 211 formed above the channel region, a gate electrode 210 formed above the gate oxidation layer, a source electrode 251 and a drain electrode 252 formed at two sides of the gate electrode on the substrate and being lower than the gate electrode;

a passivation layer 300 laid above the TFT assembly, a preset pixel region being etched to from a photonic crystal array, and the photonic crystal array having a period and a unit structure size which depend on a preset color of the preset pixel region;

a pixel definition layer 400 formed above the passivation layer 300 to form a pixel region.

In an embodiment of the present invention, the MOS structure with the monocrystalline silicon as its substrate is used to replace the TFT assembly to achieve a function of driving the organic light emitting diodes. The above channel region may be a p-type channel region, or may be an n-type channel region. They correspond to a monocrystalline silicon NMOS device and a monocrystalline silicon PMOS device, respectively. Correspondingly, the resultant back plate may be a monocrystalline silicon NMOS back plate or a monocrystalline silicon PMOS back plate. The specific explanations to them will be omitted herein.

In an embodiment of the present invention, it also provides a method for producing the OLED pixel unit shown in FIG. 10. The method may include Steps A'-C'.

Step A': producing a TFT assembly on a monocrystalline silicon substrate;

The Step A' for producing the TFT assembly may in particular include:

Sub-step A0': cleaning the monocrystalline silicon substrate;

Sub-step A1': depositing a layer of silicon nitride as a separation layer on the monocrystalline silicon substrate and implanting boron ions to form channel interruption regions 261;

Sub-step A2': depositing a gate oxidation layer on the monocrystalline silicon substrate between the channel interruption regions;

Sub-step A3': depositing polycrystalline silicon on the gate oxidation layer and heavily doping it to form a gate elctrode 210;

Sub-step A4': implanting arsenic ions on the substrate below both sides of the gate electrode using self-alignment to form a source electrode 251 and a drain electrode 252;

Sub-step A5': depositing silicon nitride or silicon oxide above the gate electrode, the source electrode and the drain electrode and forming holes by lithographic and etching processes, depositing metal such as Al to form a source metal wiring or drain metal wiring so as to finalize metallization.

Step B': depositing a $SiO_2$ layer of about 100 nm above the TFT assembly as a passivation layer.

Step C': etching the preset pixel region in the passivation layer to form the photonic crystal array on the basis of the preset shape and period, the period and unit structure size of the photonic crystal array depending on the preset color of the current OLED pixel unit.

The subsequent processes of forming the anode, forming the pixel definition layer and forming the white-light organic light emitting diode are same as the above embodiments. The specific explanations to them will be omitted herein.

It should be noted that the main processes for producing the OLED pixel unit on the basis of the monocrystalline silicon is similar to the previously described embodiments. The specific explanations to them will be omitted herein.

Figure 11:
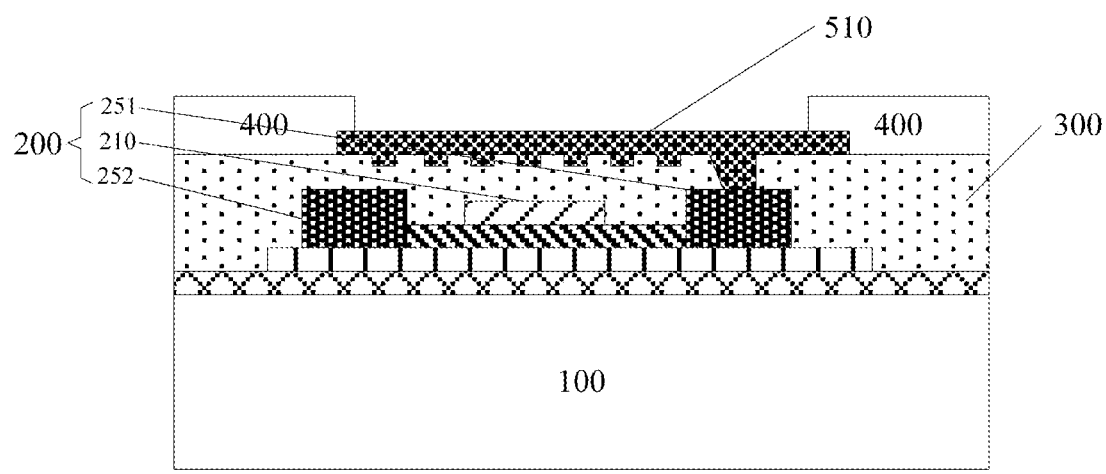
FIG. 11 shows schematically a structure of a back plate in an OLED pixel unit according to an embodiment of the present invention.

In an embodiment of the present invention, it also provides another OLED pixel unit. The OLED pixel unit in the embodiment is distinguished from the OLED pixel unit in the above embodiments in that the TFT assembly uses a top gate structure, as illustrated in FIG. 11.

The skilled person in the art should know distinction between the top gate TFT assembly and the bottom gate TFT assembly. The parts of the AM organic light emitting diode other than the top gate TFT assembly may be understood with reference to the relative explanations in the second embodiment. The specific explanations to them will be omitted herein.

In an embodiment of the present invention, it also provides another OLED pixel unit including the two dimensional photonic crystal, which is distinguished from the OLED pixel unit in the above embodiments in that the two dimensional photonic crystal array is formed in the gate insulation layer within the preset pixel region. As the two dimensional photonic crystal array is formed in the gate insulation layer, the preset periodic protrusions are formed in the passivation layer, the anode and the like above the region so as to achieve the function of wavelength selection.

As such, the two dimensional photonic array may also be formed in structures such as a substrate, a buffer layer, drive assembly constitutive film layers (such as a gate insulation layer, an active layer, an etch stop layer, a source electrode or a drain electrode), a pixel definition layer, and organic light emitting diode constitutive film layers (such as a cathode or an anode). Or, the photonic crystal array may be formed by cooperation of two or more layers. As long as the position of the two dimensional photonic crystal array meets the condition that it is located at a light exit side of the organic light emitting diode, or the two dimensional photonic crystal array is arranged in the light emitting path of the organic light emitting diode, the function of light selection may be achieved to achieve the embodiments of the present invention. It follows the same principle as the above embodiments. The specific explanations to them will be omitted herein.

To this end, various embodiments of the present invention have been described with reference to drawings. From the above description, the skilled person in the art will know the OLED pixel unit and the method for producing the same, the display panel and the display apparatus explicitly.

In addition, the above definitions to various elements and methods are not limited to the respective structures, shapes or forms described in the above embodiments. The skilled person in the art can modify or replace it, for example, (1) besides the IGZO-TFT back plate in the above embodiments, embodiments of the present invention may also use an α-Si TFT back plate, a LTPS TFT back plate, a monocrystalline silicon NMOS back plate, a monocrystalline silicon PMOS back plate, a monocrystalline silicon CMOS back plate or the like, and the TFT structure should be understood as being any suitable structure disclosed in the prior art, but embodiments of the present invention are not limited to this;

(2) besides the two dimensional photonic crystal array, the three dimensional photonic crystal array may also be used to achieve wavelength selection to achieve the embodiments of the present invention; the three dimensional photonic crystal array may be produced by the following method: depositing a plurality of film layers, forming an array by etching after depositing the odd film layers and covering the even film layers directly, so as to form the three dimensional crystal structure after the plurality of layers are processed as described above;

(3) in the above embodiment, the material for forming the photonic crystal is mostly $SiO_2$, but other materials may also be used to form the photonic crystal array, for example, inorganic insulation materials such as silicon nitride and titanium oxide, organic insulation materials, composite material composed of two or more insulation materials or conductive materials;

(4) although the white-light organic light emitting diode is used in the above embodiments, the skilled person in the art should know that, for the organic light emitting diode covering a certain wavelength range other than the white-light organic light emitting diode, the light selection may also be achieved by the photonic crystal array as long as the preset color is within the wavelength range. Thus, embodiments of the present invention are not limited to the white-light organic light emitting diode.

In summary, the present disclosure uses the two dimensional photonic crystal to select the colors of the OLED. It utilizes the mature conventional means and can achieve a high fineness over other methods. It may be applied to produce the micro-size (<1 inch) OLED display panel with high resolution and super high resolution and thus has a good application prospect.

The objects, solutions and advantageous effects of the present disclosure have been described in details with reference to the above specific embodiments. It should be understood that the above embodiments are given only by ways of examples instead of limiting the present invention. Any changes, equivalent replacement, modification within the spirit and principles of the disclosure can be made by those skilled in the art and should fall into the scope of the present invention.

The invention claimed is:

1. An organic light emitting diode (OLED) pixel unit, comprising:
    an organic light emitting diode configured to emit a light within a wavelength range; and
    a photonic crystal array located at a light exit side of the organic light emitting diode, and structural parameters of the photonic crystal array depend on a preset color of the OLED pixel unit,
    wherein the light emitted from the organic light emitting diode has a wavelength which is selected by the photonic crystal array such that the preset color is presented at the light exit side of the organic light emitting diode, and
    wherein the OLED pixel unit further comprises:
        a substrate;
        a drive assembly formed on the substrate; and
        a passivation layer located above the drive assembly and covering the drive assembly, wherein the organic light emitting diode has an anode connected electrically to the drive assembly through a via hole on the passivation layer,
        wherein the photonic crystal array is formed on the passivation layer, and a part of material of the anode of the organic light emitting diode is filled in the photonic crystal array, and the photonic crystal array is formed on a side of the passivation layer facing away from the drive assembly and facing towards the anode.

2. The OLED pixel unit according to claim 1, wherein the organic light emitting diode is a white-light organic light emitting diode.

3. The OLED pixel unit according to claim 1, wherein the structural parameters of the photonic crystal array are calculated out by a plane wave method, a transfer matrix method or a finite element method.

4. The OLED pixel unit according to claim 1, further comprising:
    a buffer layer formed between the substrate and the drive assembly,
    wherein the photonic crystal array is formed in the buffer layer.

5. The OLED pixel unit according to claim 1, wherein the drive assembly is a TFT assembly, a NMOS assembly, a PMOS assembly or a CMOS assembly.

6. The OLED pixel unit according to claim 5, wherein the substrate is transparent and the TFT assembly is a bottom gate TFT assembly which comprises:
 a gate electrode formed on the substrate;
 a gate insulation layer formed above the gate electrode and the substrate that is transparent and not covered by the gate electrode;
 an active layer formed above the gate insulation layer;
 an etch stop layer formed above the active layer; and
 a source electrode and a drain electrode formed on both sides of the etch stop layer and located above the active layer and the gate insulation layer that is not covered by the active layer,
 wherein the photonic crystal array is formed in any film layer of the gate electrode, the gate insulation layer, the active layer, the etch stop layer, the source electrode or the drain electrode.

7. The OLED pixel unit according to claim 1, wherein the organic light emitting diode comprises:
 a first electrode;
 a light emitting layer formed on the first electrode;
 a second electrode formed on the light emitting layer.

8. The OLED pixel unit according to claim 7, wherein the photonic crystal array is formed in a film layer of the first electrode or second electrode.

9. An OLED display panel, comprising one or more OLED pixel units according to claim 1.

10. The OLED display panel according to claim 9, wherein the organic light emitting diode and the corresponding photonic crystal array having a wavelength selection function are arranged periodically on the OLED display panel.

11. A display apparatus comprising an OLED display panel according to claim 9.

12. The display apparatus according to claim 11, wherein the organic light emitting diode and the corresponding photonic crystal array having a wavelength selection function are arranged periodically on the OLED display panel.

13. A method for producing an OLED pixel unit, the method being used to produce the OLED pixel unit according to claim 1, the method comprising:
 forming an organic light emitting diode; and
 before forming the organic light emitting diode or during formation of the organic light emitting diode, forming a photonic crystal array at a light exit side of the organic light emitting diode.

14. The OLED pixel unit according to claim 1, wherein the photonic crystal array is a two dimensional photonic crystal array, which is a rectangular periodic structure, a rhombic periodic structure or a quasi-periodic structure, and wherein a constitutive unit of the two dimensional photonic crystal array is a recess, a protrusion, or a mixed structure composed of the recess and the protrusion.

15. The OLED pixel unit according to claim 14, wherein the recess is a cylindrical hole or ball-shaped recess, and the protrusion is a cylindrical or ball-shaped protrusion.

16. The OLED pixel unit according to claim 1, wherein:
 for the OLED pixel unit having the preset color of blue, the cylindrical hole recess has a diameter D1 which meets: 245 nm≤D1≤255 nm, and has a hole spacing L1 in X direction and Y direction, which meets: 335 nm≤L1≤345 nm;
 for the OLED pixel unit having the preset color of green, the cylindrical hole recess has a diameter D2 which meets: 215 nm≤D2≤225 nm, and has a hole spacing L2 in X direction and Y direction, which meets: 135 nm≤L2≤145 nm; or
 for the OLED pixel unit having the preset color of red, the cylindrical hole recess has a diameter D3 which meets: 95 nm≤D3≤105 nm, and has a hole spacing L3 in X direction and Y direction, which meets: 295 nm≤L3≤305 nm.

* * * * *